United States Patent
Kao et al.

(10) Patent No.: US 12,414,320 B2
(45) Date of Patent: Sep. 9, 2025

(54) FIN FIELD-EFFECT TRANSISTOR DEVICE WITH COMPOSITE LINER FOR THE FIN

(71) Applicant: Taiwan Semiconductor Manufacturing Co., Ltd., Hsinchu (TW)

(72) Inventors: Wan-Yi Kao, Baoshan Township (TW); Chung-Chi Ko, Nantou (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/413,716

(22) Filed: Jan. 16, 2024

(65) Prior Publication Data
US 2024/0178321 A1   May 30, 2024

Related U.S. Application Data

(60) Continuation of application No. 17/378,387, filed on Jul. 16, 2021, now Pat. No. 11,894,464, which is a division of application No. 16/509,940, filed on Jul. 12, 2019, now Pat. No. 11,069,812.

(60) Provisional application No. 62/738,860, filed on Sep. 28, 2018.

(51) Int. Cl.
  *H10D 30/62* (2025.01)
  *H01L 21/02* (2006.01)
  *H10D 30/01* (2025.01)

(52) U.S. Cl.
  CPC ... *H10D 30/6215* (2025.01); *H01L 21/02532* (2013.01); *H10D 30/0243* (2025.01)

(58) Field of Classification Search
  CPC ............ H01L 21/02532; H01L 29/165; H01L 29/4966; H01L 29/66545; H01L 29/66795; H01L 29/6681; H01L 29/7848; H01L 29/785; H01L 29/7855; H10D 30/6215; H10D 30/0243
  See application file for complete search history.

(56) References Cited

U.S. PATENT DOCUMENTS

| | | | |
|---|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |

(Continued)

FOREIGN PATENT DOCUMENTS

KR   20180069698 A   6/2018

*Primary Examiner* — Nelson Garces
(74) *Attorney, Agent, or Firm* — Slater Matsil, LLP

(57) ABSTRACT

A method of forming a semiconductor device includes forming a fin protruding above a substrate; forming a liner over the fin; performing a surface treatment process to convert an upper layer of the liner distal to the fin into a conversion layer, the conversion layer comprising an oxide or a nitride of the liner; forming isolation regions on opposing sides of the fin after the surface treatment process; forming a gate dielectric over the conversion layer after forming the isolation regions; and forming a gate electrode over the fin and over the gate dielectric.

20 Claims, 14 Drawing Sheets

(56) References Cited

U.S. PATENT DOCUMENTS

| | | | |
|---|---|---|---|
| 11,894,464 B2* | 2/2024 | Kao | H01L 29/66795 |
| 2014/0312387 A1 | 10/2014 | Kim | |
| 2016/0365245 A1* | 12/2016 | Huang | H01L 21/32055 |
| 2016/0380056 A1 | 12/2016 | Yeo et al. | |
| 2017/0104061 A1 | 4/2017 | Peng et al. | |
| 2017/0373058 A1* | 12/2017 | Tsau | H01L 21/32115 |
| 2018/0019327 A1* | 1/2018 | Hsu | H01L 21/76224 |
| 2018/0175175 A1 | 6/2018 | Yeong et al. | |
| 2018/0269109 A1 | 9/2018 | Ching et al. | |

* cited by examiner

FIN FIELD-EFFECT TRANSISTOR DEVICE WITH COMPOSITE LINER FOR THE FIN

PRIORITY CLAIM AND CROSS-REFERENCE

This application is a continuation of U.S. patent application Ser. No. 17/378,387, filed Jul. 16, 2021, entitled "Fin Field-Effect Transistor Device with Composite Liner for the Fin," which is a divisional of U.S. patent application Ser. No. 16/509,940, filed on Jul. 12, 2019, entitled "Fin Field-Effect Transistor Device and Method of Forming the Same", now U.S. Pat. No. 11,069,812, issued Jul. 20, 2021, which claims priority to U.S. Provisional Patent Application No. 62/738,860, filed Sep. 28, 2018, entitled "Amorphous Si Selectivity Loss Reduction," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a liner for the fins and treating the liner to prevent or reduce crystallization of the liner during subsequent thermal processes.

In some embodiments, a liner comprising amorphous silicon is formed over the semiconductor fins of a FinFET device. A surface treatment process is performed to convert an upper layer of the liner into a conversion layer, which may be an oxide or a nitride. In an embodiment where the conversion layer is an oxide (e.g., silicon oxide), the surface treatment process is performed by exposing the liner to an oxygen-containing ambient, treating the liner with an oxygen-containing gas, treating the liner with a plasma of oxygen, or applying an oxygen-containing chemical on the liner. In an embodiment where the conversion layer is a nitride (e.g., silicon nitride), the surface treatment process is performed by treating the liner with an ammonia-containing gas, or treating the liner with a plasma of ammonia. The surface treatment process prevents or reduces crystallization of the liner (e.g., an amorphous silicon layer) during subsequent thermal processes, thereby reducing or avoiding defects in the liner related with crystallization of the liner. As a result, yield of the production is improved, and thermal processes after formation of the liner are no longer constrained to low temperature processes.

Figure 1:
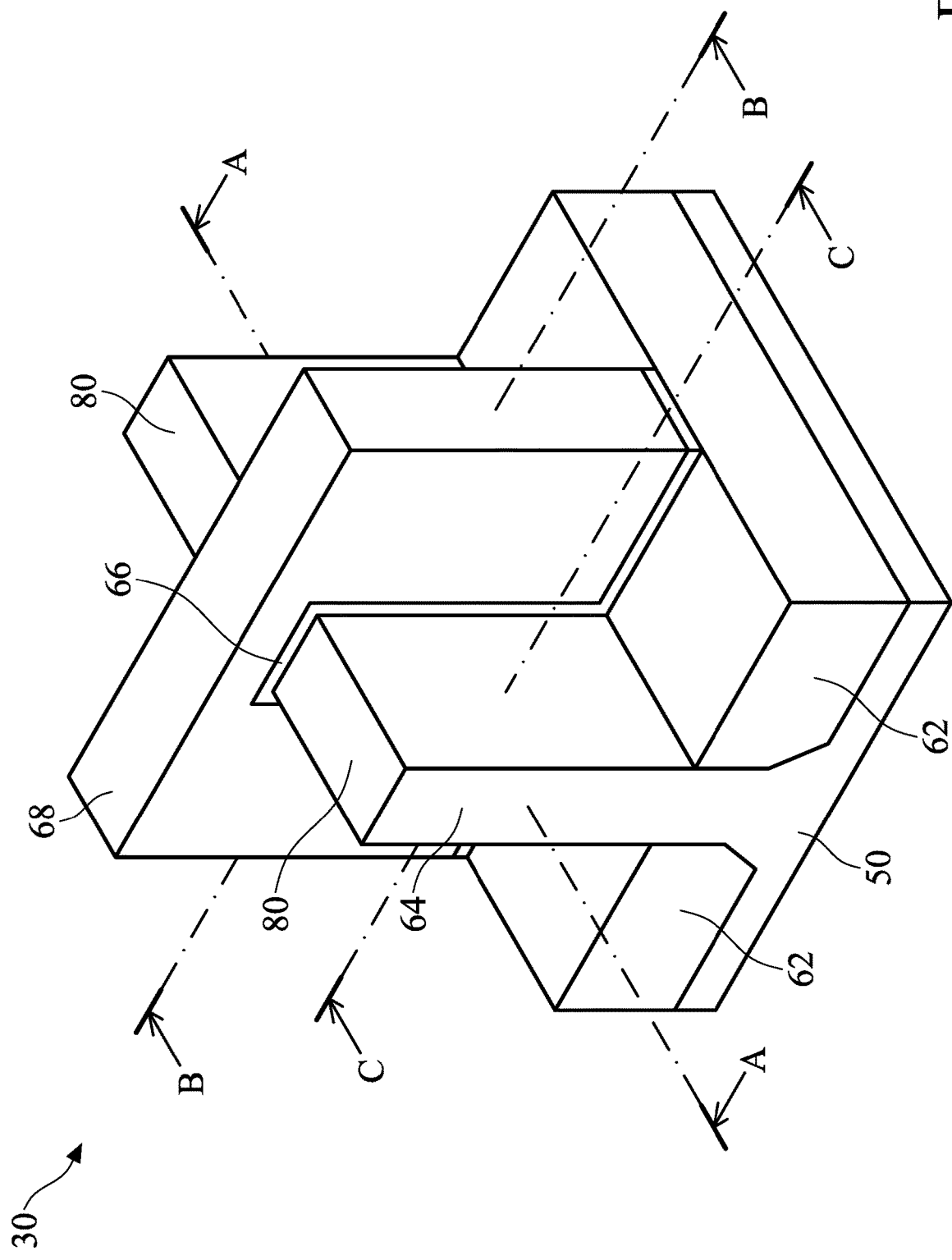
FIG. 1 illustrates a perspective view of a Fin Field-Effect Transistor (FinFET) device, in accordance with some embodiments.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures may refer to these reference cross-sections for clarity.

Figure 10:
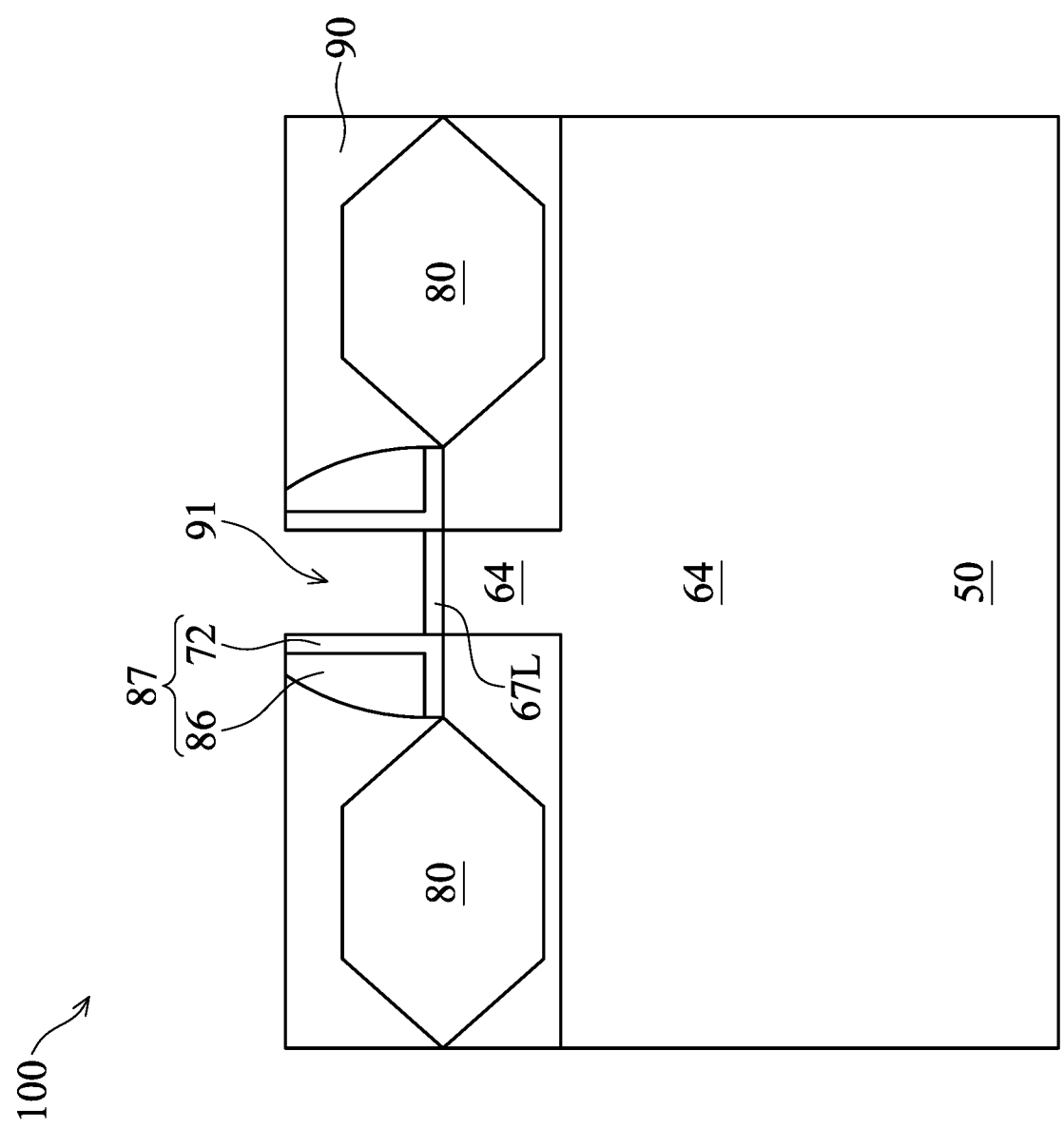
Figure 11:
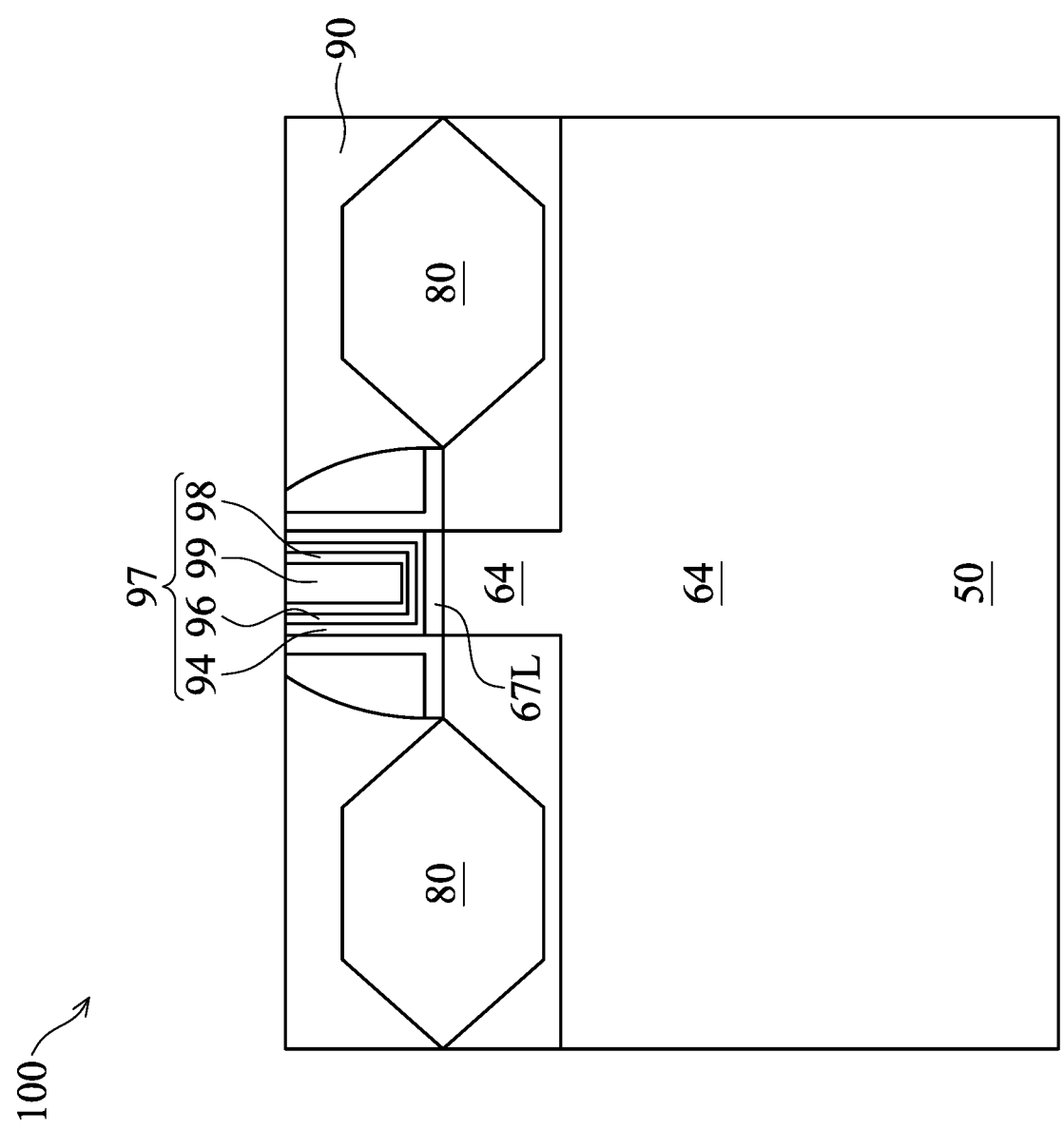
Figure 12A:
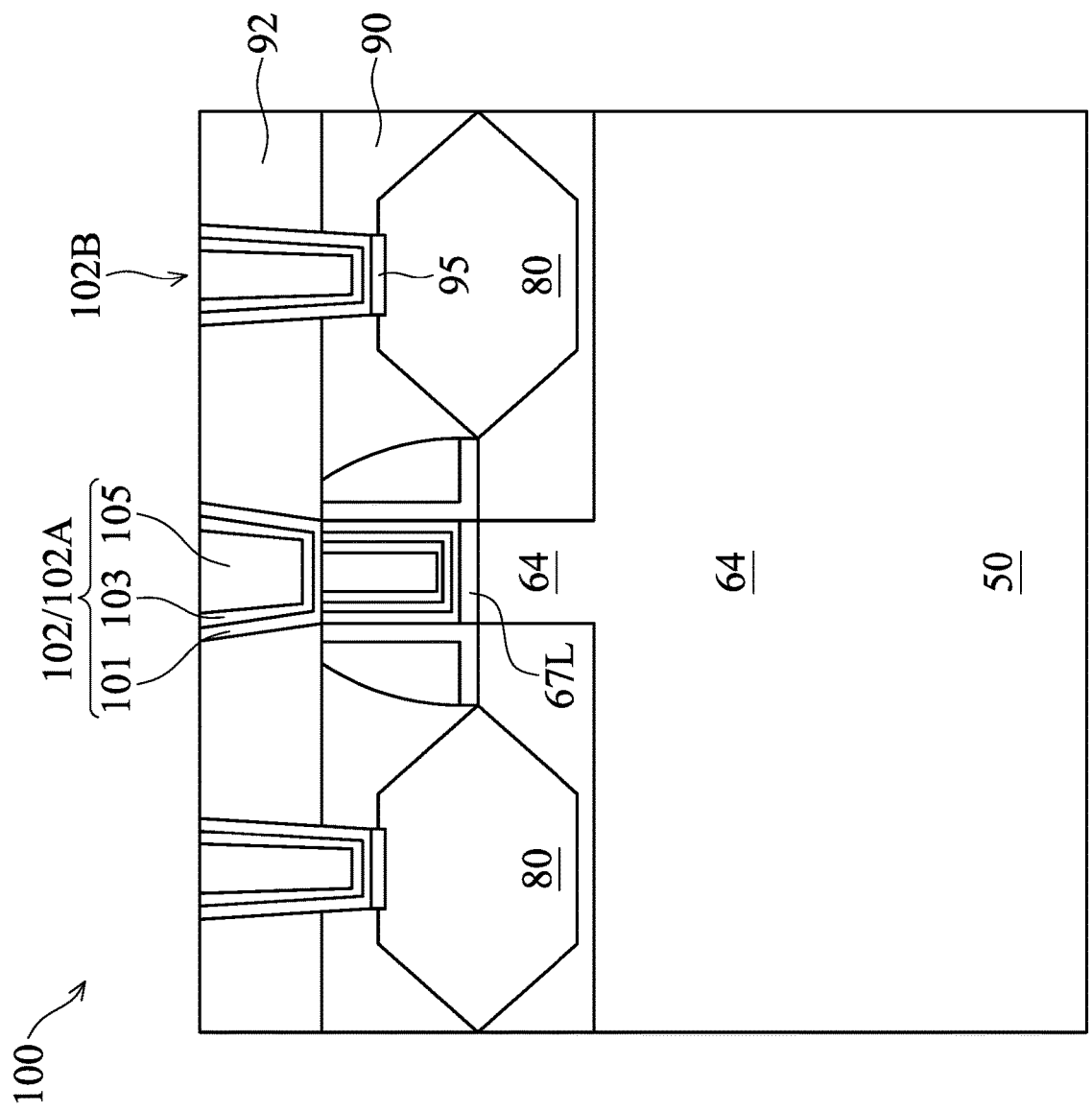
Figure 12B:
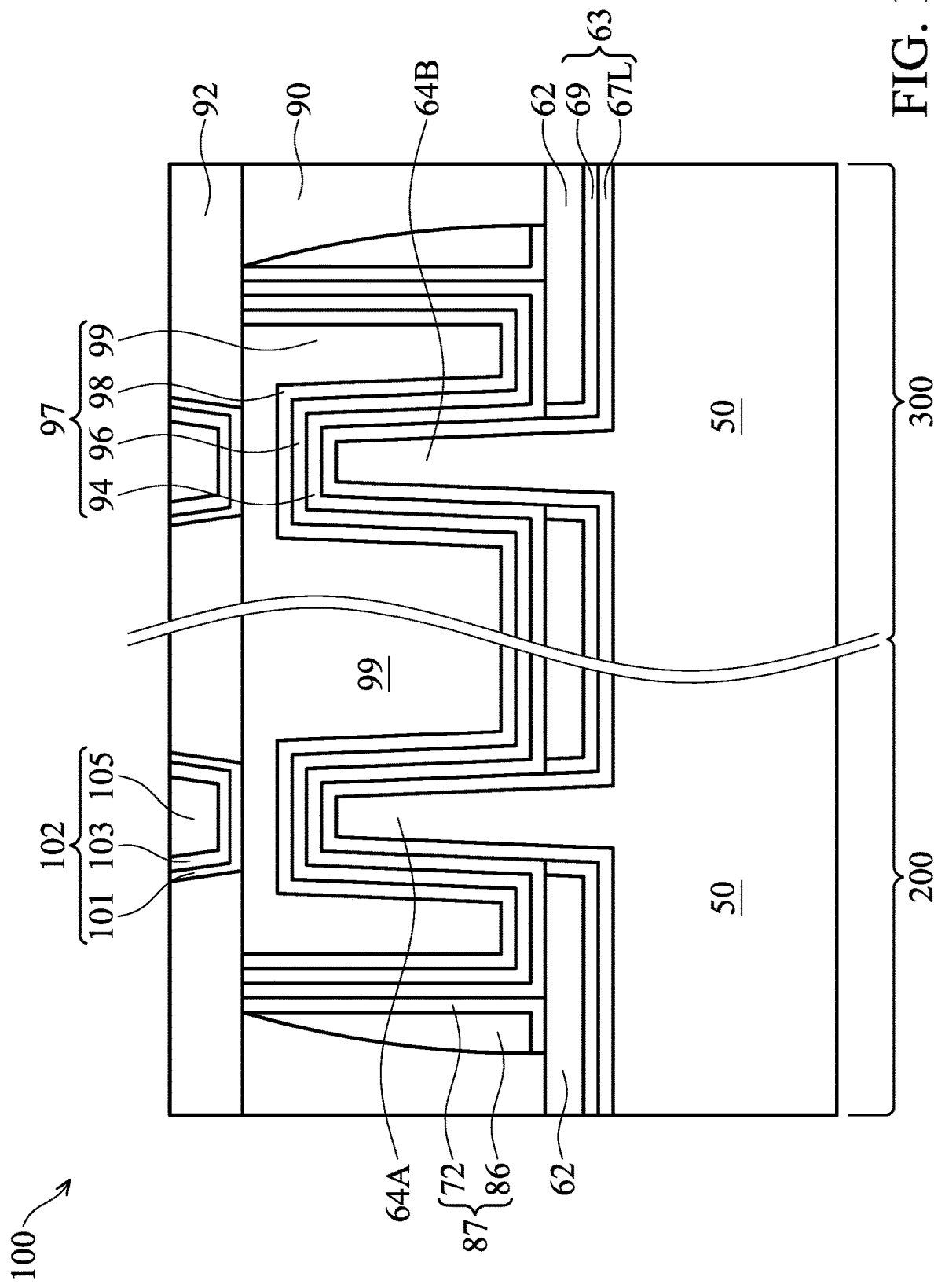

FIGS. 2-11, 12A, and 12B are cross-sectional views of a FinFET device 100 at various stages of fabrication in accordance with an embodiment. The FinFET device 100 is similar to the FinFET 30 in FIG. 1, but with multiple fins. FIGS. 2-7 illustrate cross-sectional views of the FinFET device 100 along cross-section B-B. FIGS. 8-11 and 12A illustrate cross-sectional views of the FinFET device 100 along cross-section A-A, and FIG. 12B illustrates a cross-sectional view of the FinFET device 100 along cross-section B-B.

Figure 2:
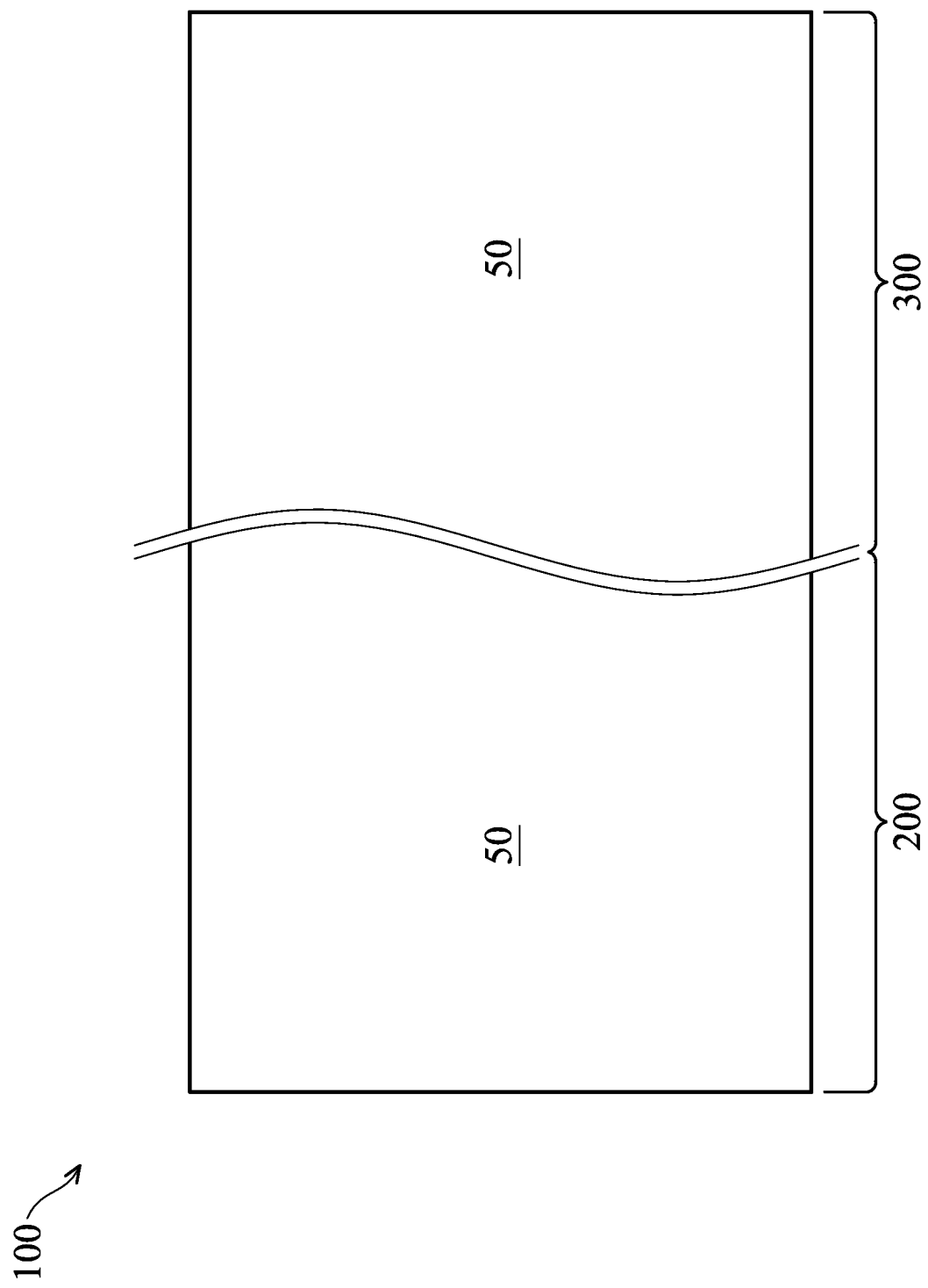
FIGS. 2-11, 12A, and 12B illustrate various cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As illustrated in FIG. 2, the substrate includes a first portion in region 200, and a second portion in region 300. The first portion of the substrate 50 in region 200 may be used to form P-type devices such as P-type metal-oxide-semiconductor field-effect transistors (MOSFETs), and the second portion of the substrate 50 in region 300 may be used to form N-type devices such as N-type MOSFETs. Therefore, the region 200 may be referred to as a PMOS region or P-type device region, and the region 300 may be referred to as an NMOS region or N-type device region, in some embodiments. In other embodiments, both region 200 and region 300 are PMOS regions or NMOS regions.

In some embodiments, upper portions of the substrate 50 in region 200 are removed and replaced with an epitaxial material suitable for the type (e.g., P-type) of device to be formed. Similarly, upper portions of the substrate 50 in region 300 may be removed and replaced with an epitaxial material suitable for the type (e.g., N-type) of device to be formed. For example, to replace the upper portions of the substrate 50 in the region 200 with an epitaxial material, a patterned photoresist may be formed over the substrate 50, which patterned photoresist covers the region 300 while exposing the region 200. Next, an etching process is performed to remove the exposed upper portions of the substrate 50 in the region 200. After the etching process, an epitaxy grow process is performed to grow a suitable epitaxial material, such as an epitaxial silicon germanium material, in the region 200. The epitaxial material may be patterned to form semiconductor fins (see, e.g., fins 64 in FIG. 3) in subsequent processing.

Figure 3:
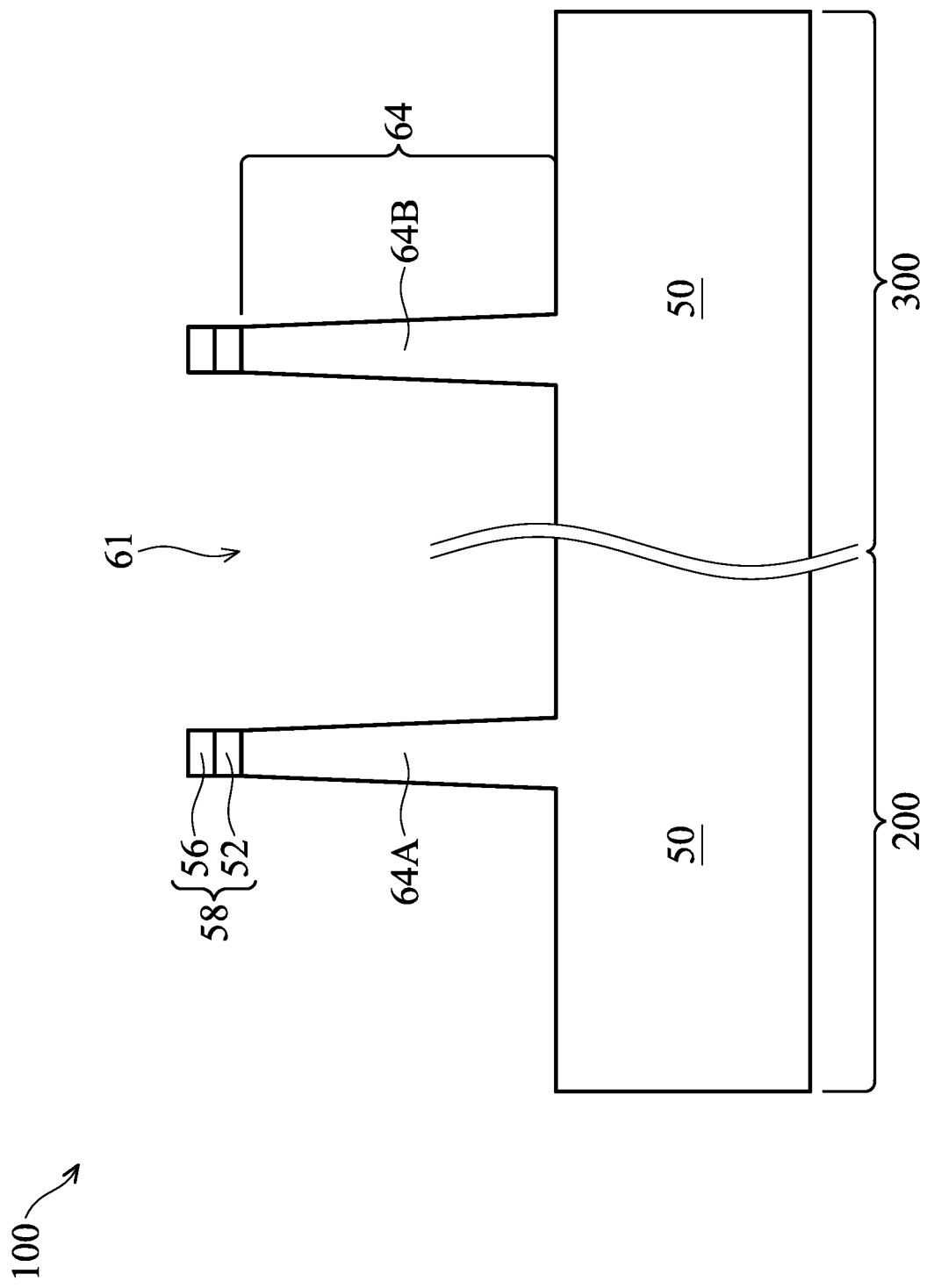

Referring next to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter. The patterned mask 58 may be removed by a suitable removal process after the fins 64 are formed.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

In some embodiments, the fin 64A in the region 200 is formed of an epitaxial silicon germanium material (e.g., a crystalline silicon germanium material), and the fin 64B in the region 300 is formed of an epitaxial silicon material (e.g., a crystalline silicon material). The different materials of the fins 64A and 64B may be chosen to form different types (e.g., P-type or N-type) of devices in the regions 200 and 300.

FIGS. 2 and 3 illustrate an embodiment of forming fins 64, but fins may be formed in various different processes. For example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 4:
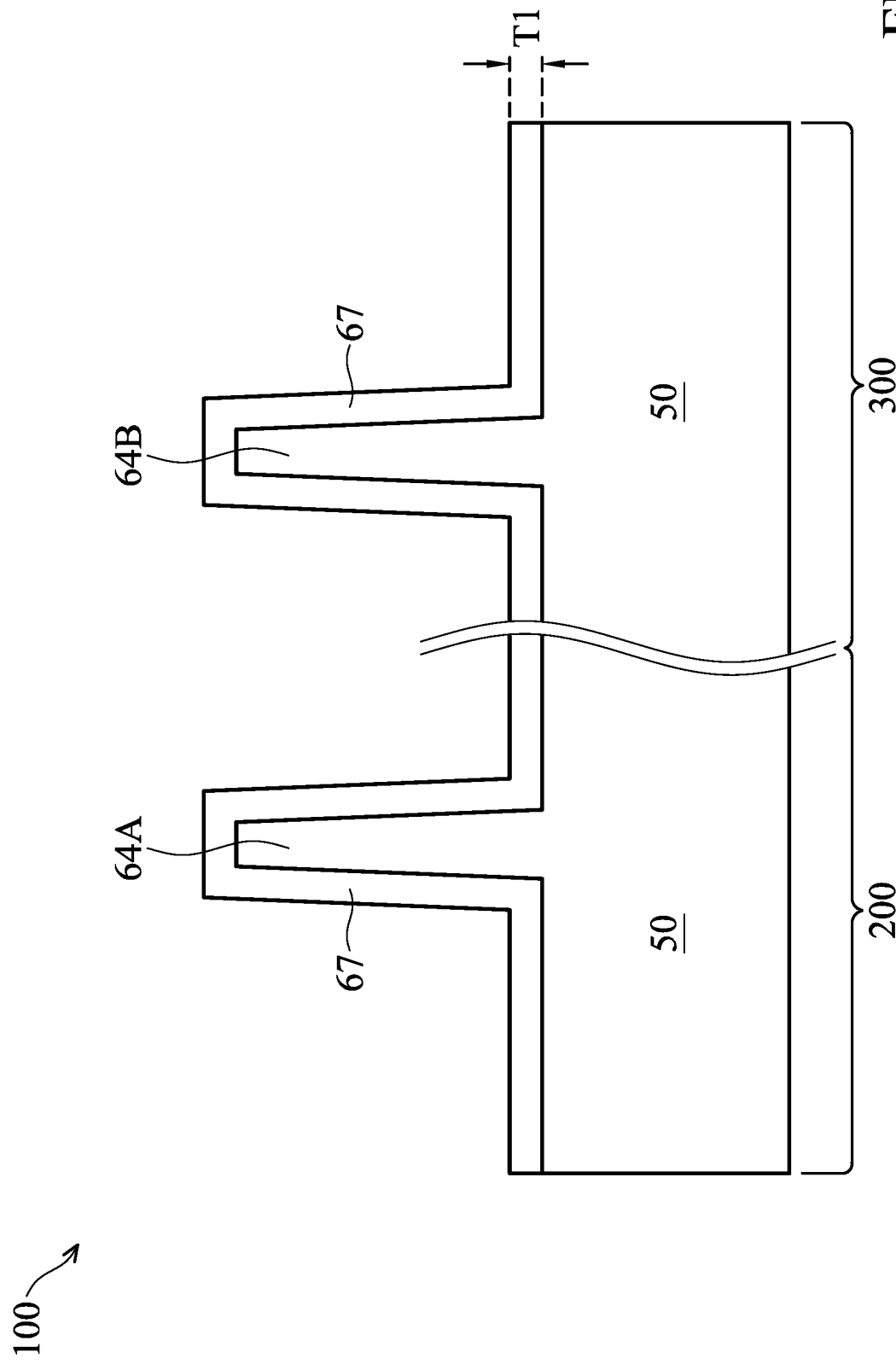

Next, in FIG. 4, a liner 67 (also referred to as a liner layer) is formed over the fins 64 and the substrate 50. The liner 67 serves to protect the materials of the fins 64, e.g., from being oxidized. The liner 67 may be conformally deposited over the substrate 50 to cover the upper surface of the substrate 50 and to cover sidewalls and top surfaces of the fins 64. The liner 67 may be formed of a suitable semiconductor material, such as amorphous silicon. In the illustrated embodiment, the liner 67 is layer of amorphous silicon formed using a suitable formation method, such as chemical vapor deposition (CVD). In the example of FIG. 4, the material (e.g., amorphous silicon) of the liner 67 is different from the material (e.g., crystalline silicon germanium) of the fins 64A and different from the material (e.g., crystalline silicon) of the fin 64B. A thickness T1 of the liner 67 may be between about 5 angstroms and about 25 angstroms, such as 15 angstroms, as an example.

Figure 5:
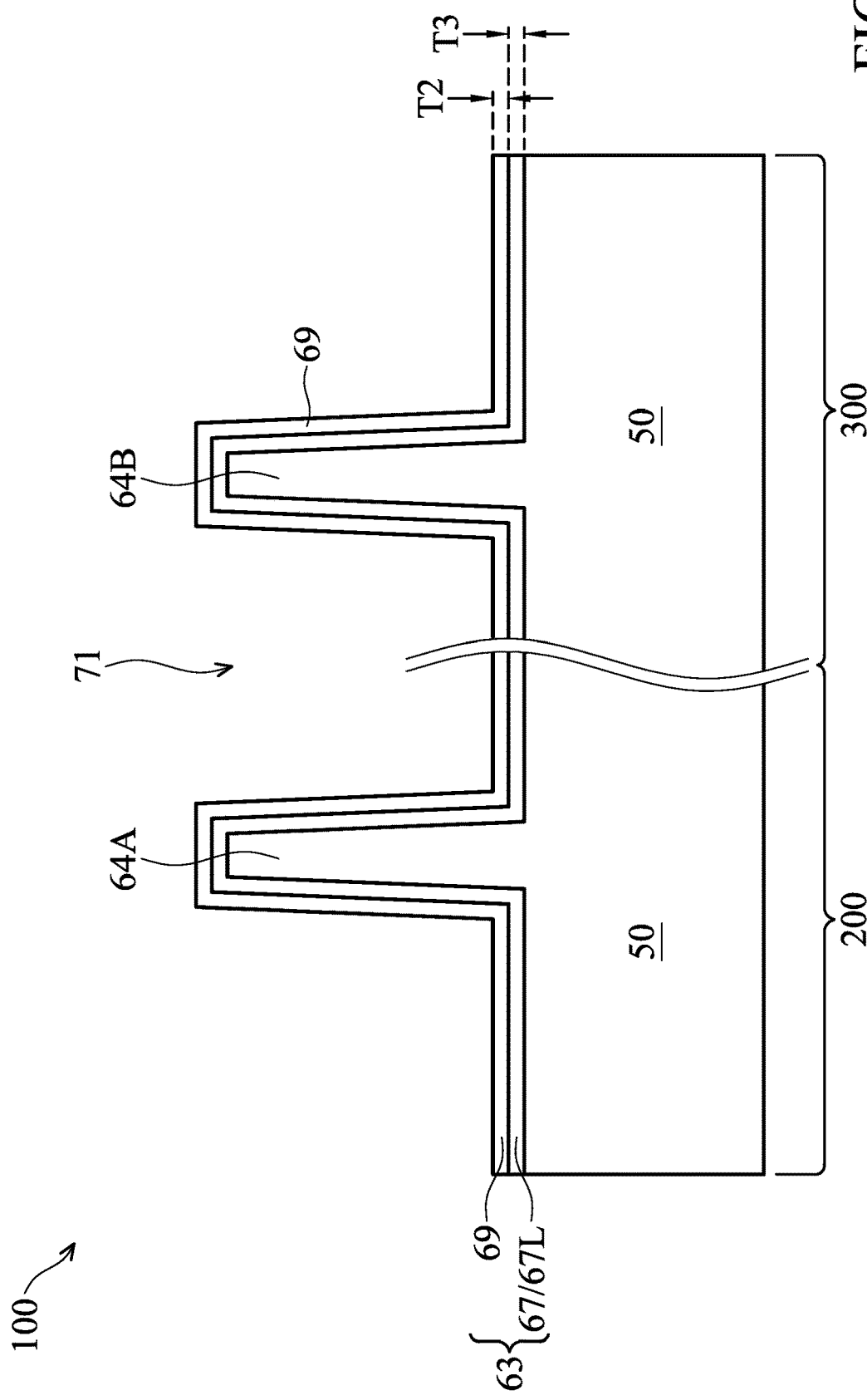

Next, as illustrated in FIG. 5, a surface treatment process 71 is performed to convert an upper layer of the liner 67 into a conversion layer 69, which conversion layer 69 is a dielectric layer, such as an oxide or a nitride of the material of the liner 67. The remaining portion of the liner 67 (also referred to as a lower layer 67L), which contacts the fins 64 and the substrate 50, remains unchanged (e.g., remains a layer of amorphous silicon) after the surface treatment process 71. The conversion layer 69 and the remaining portion of the liner 67 (e.g., the lower layer 67L) may be collectively referred to as a composite liner 63.

In some embodiments, the surface treatment process 71 is an oxidization process, in which case the conversion layer 69 is an oxide (e.g., silicon oxide) of the material of the liner 67 (e.g., amorphous silicon). Various embodiments of the oxidization process are discussed hereinafter.

In an embodiment, the surface treatment process 71 is performed by exposing the liner 67 in an oxygen-containing ambient (e.g., the atmosphere) for a pre-determined period of time, such as about 37 hours. In another embodiment, the surface treatment process 71 is performed by treating the liner 67 with a thermal gas flow using a gas source that comprises oxygen. For example, a gas mixture comprising oxygen and a carrier gas, such as nitrogen, may be supplied to the surface of the liner 67 at a temperature of about 600° C. and at about atmospheric pressure (e.g., 760 Torr). The gas mixture may include about 12% of oxygen and about 88% of the carrier gas (e.g., nitrogen) in volume. The thermal gas flow may be supplied to the liner 67 for a duration between about 10 seconds and 120 seconds.

In an embodiment, the surface treatment process 71 is a plasma process performed by treating the liner 67 with a plasma of oxygen. For example, a gas source comprising an oxygen gas and a carrier gas (e.g., nitrogen) may be used for the plasma process. The oxygen gas is ignited into a plasma of oxygen, and the plasma is then carried by the carrier gas into a processing chamber in which the FinFET device 100 is disposed. The plasma of oxygen reacts with the liner 67 and coverts the upper portion of the liner 67 into the conversion layer 69. The plasma process may be performed at a temperature between about 25° C. and about 250° C. and at a pressure between about 50 Torr and about 900 Torr. A flow rate of the oxygen may be between about 5 standard cubic centimeter per minute (sccm) and about 1 sccm, and a flow rate of the carrier gas (e.g., nitrogen) may be between about 1 sccm and about 10 sccm.

In yet another embodiment, the surface treatment process 71 is a cleaning process performed by applying an oxygen-containing chemical to the liner 67. The oxygen-containing chemical is a mixture of de-ionized water (DIW) and ozone (e.g., $O_3$), in some embodiments. A volume percentage of the ozone in the mixture may be between about 1% and about 99%, as an example.

In some embodiments, the surface treatment process 71 is a nitridation process, in which case the conversion layer 69 is a nitride (e.g., silicon nitride) of the material of the liner 67 (e.g., amorphous silicon). Various embodiments of the nitridation process are discussed hereinafter.

In an embodiment, the surface treatment process 71 is performed by treating the liner 67 with a thermal gas flow using a gas source that comprises ammonia. For example, a gas mixture comprising ammonia (e.g., $NH_3$) and a carrier gas, such as nitrogen, may be supplied to the surface of the liner 67 at a temperature of about 600° C. and at about atmospheric pressure (e.g., 760 Torr). The gas mixture may include about 12% of ammonia and about 88% of the carrier gas (e.g., nitrogen) in volume. The thermal gas flow may be supplied to the liner 67 for a duration between about 10 seconds and 120 seconds.

In another embodiment, the surface treatment process 71 is a plasma process performed by treating the liner 67 with a plasma of ammonia. For example, a gas source comprising an ammonia gas and a carrier gas (e.g., nitrogen) may be used for the plasma process. The ammonia gas is ignited into a plasma of ammonia, and the plasma is then carried by the carrier gas into a processing chamber in which the FinFET device 100 is disposed. The plasma of ammonia reacts with the liner 67 and coverts the upper portion of the liner 67 into the conversion layer 69. The plasma process may be performed at a temperature between about 25° C. and about 250° C. and at a pressure between about 50 Torr and about 900 Torr. A flow rate of the ammonia may be between about 5 sccm and about 1 sccm, and a flow rate of the carrier gas (e.g., nitrogen) may be between about 1 sccm and about 10 sccm.

After the surface treatment, a thickness T2 of the conversion layer 69 (e.g., an oxide or a nitride) is between about 5 angstroms and about 10 angstroms, in some embodiment. A thickness T3 of the remaining portion (e.g., lower layer 67L) of the liner 67 may be, e.g., between about 3 angstroms about 20 angstroms. A total thickness of the composite liner 63, which is the sum of T2 and T3, may be larger than the thickness T1 of the as-deposited liner 67. This is because during the surface treatment process 71, oxygen atoms or nitrogen atoms bond with, e.g., the silicon atoms of the liner 67 to form the conversion layer 69, and as a result, portions of the liner 67 converted by the surface treatment process 71 form the conversion layer 69 with a larger thickness. For example, a top portion of the liner 67 having a thickness of 5 angstroms may be converted into a silicon oxide layer having a thickness of 10 angstroms by the surface treatment process 71.

The currently disclosure, with the disclosed surface treatment process and the structure of the composite liner 63, among others, advantageously prevents (or reduces the possibility of) the lower layer 67L (e.g., amorphous silicon) of the liner 67 from being crystallized in subsequent thermal processes, such as high-temperature deposition or thermal annealing. Without the disclosed surface treatment process, the lower layer 67L (e.g., amorphous silicon) may crystallize during a subsequent thermal process and form, e.g., crystalline silicon in granular form, which is no longer a smooth layer and may have gaps (e.g., cracks) between the crystalline silicon granules. Due to the cracks and the crystalline silicon granules, the crystallized lower layer 67L may fail to protect the fins 64 (e.g., channel regions in the fins 64) from damages in subsequent processing, and may change the critical dimension (CD) of the fins 64. The current disclosure avoids or reduces the above described issues, therefore achieving better protection of the fins 64 and could maintain the CD of the fins 64 better. In addition, the processing after the formation of the liner 67 is no longer constrained to low temperature thermal processes, thus allowing for wider choice of the subsequent processing and better thermal budget.

Figure 6:
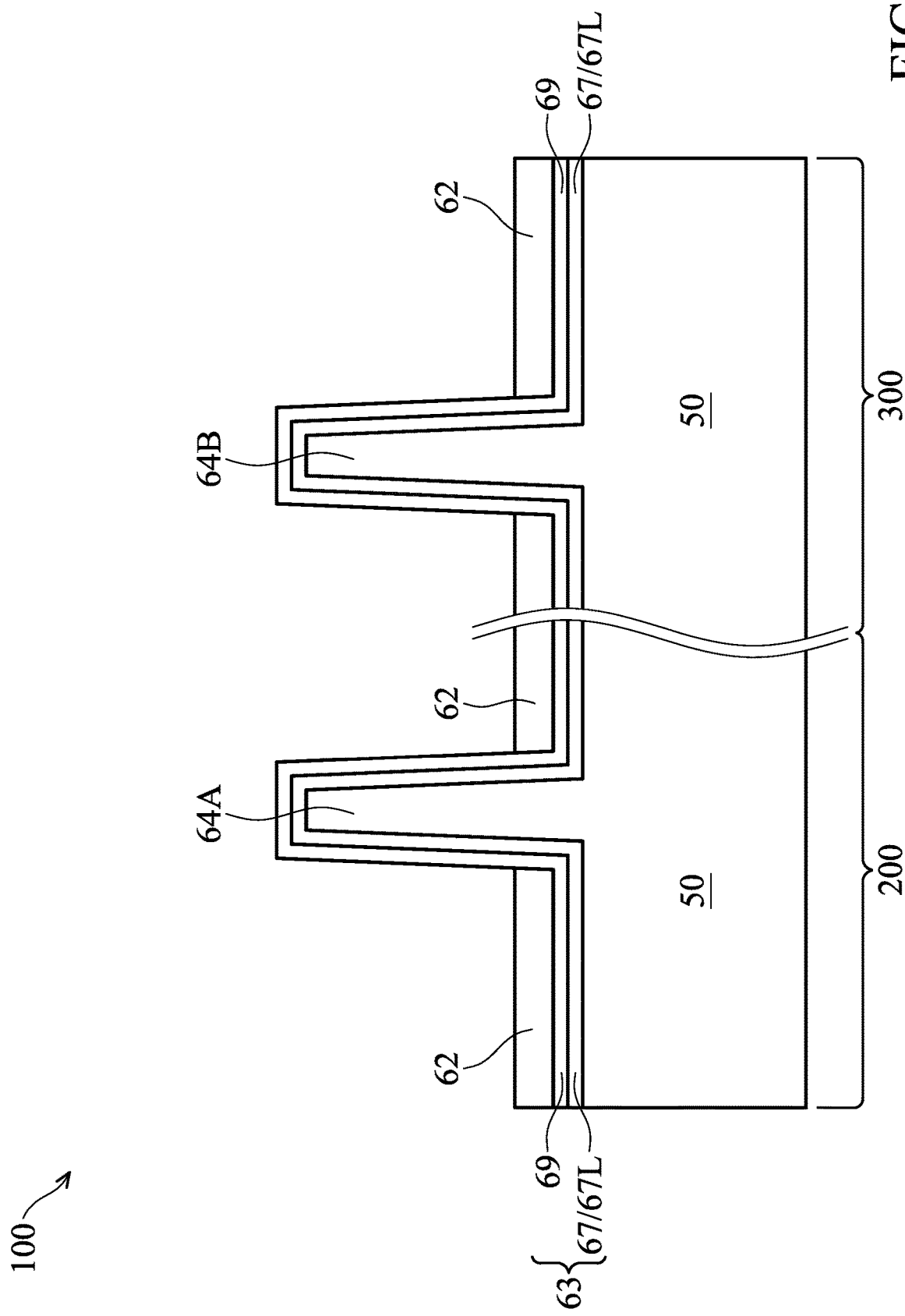

Next, FIG. 6 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62. As illustrated in FIG. 6, lower portions of the composite liner 63 are disposed between the STI regions 62 and the fins 64, and between the STI regions 62 and the substrate 50.

Figure 7:
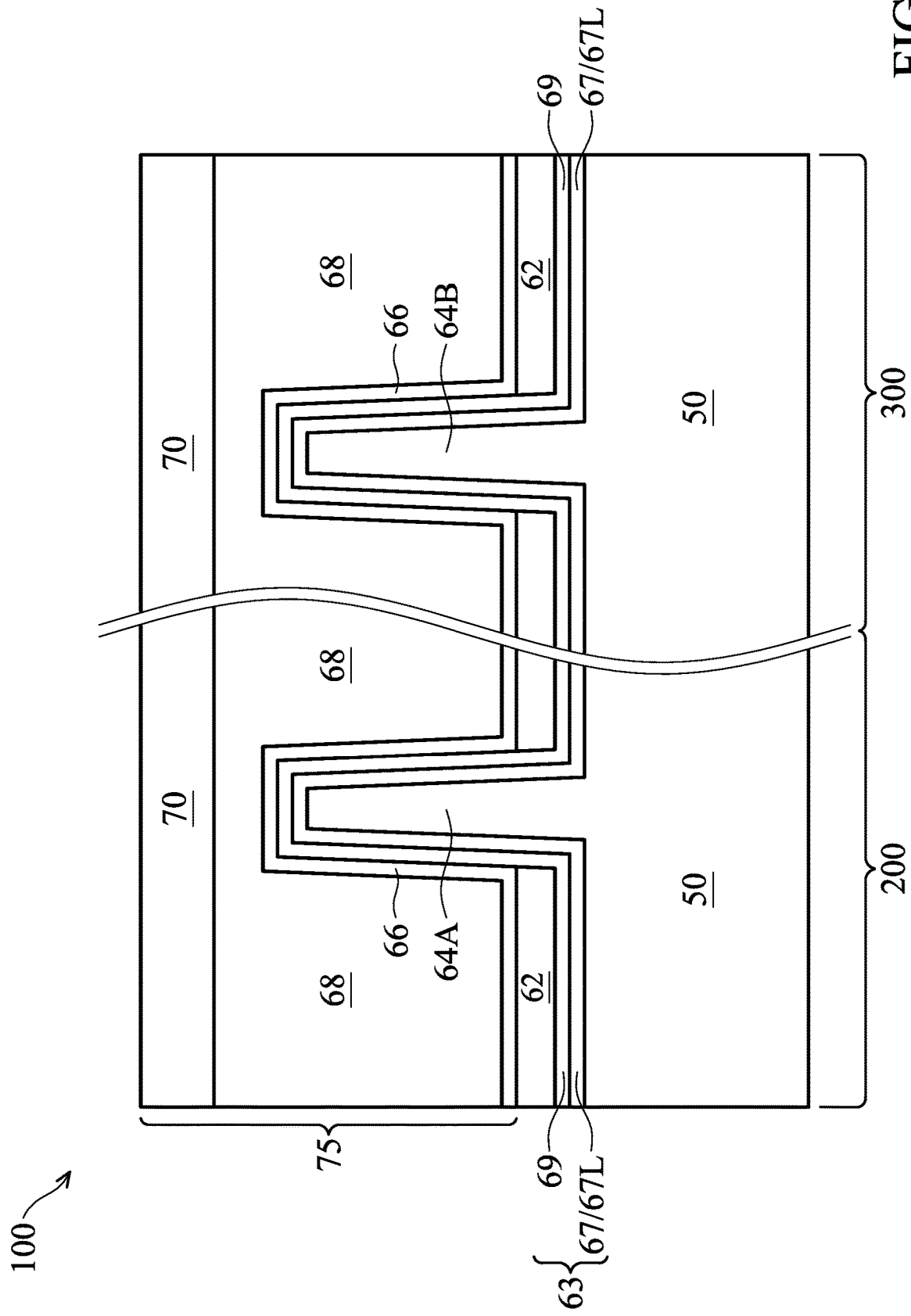

FIG. 7 illustrates the formation of dummy gate structure 75 over the semiconductor fins 64. One skilled in the art will appreciate that the dummy gate structure 75 illustrated in FIG. 7 may include a first dummy gate structure 75 formed in the region 200 and a second (e.g., separate) dummy gate structure 75 formed in the region 300. Alternatively, the dummy gate structure 75 may be formed to extend from the region 200 to the region 300, in which case a cut-metal gate process may be performed later after the dummy gate structure 75 is replaced by a metal gate, such that a first metal gate is formed in the region 200, and a second metal gate is formed in the region 300. These and other variations are fully intended to be included within the scope of the present disclosure.

As illustrated in FIG. 7, the dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64, e.g., over and contacting upper portions of the composite liner 63. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64. In some embodiments, the etching process used to form the dummy gate structures 75 also removes portions of the composite liner 63 that are disposed outside boundaries of the dummy gate structure 75 and over the upper surface of the STI regions 62. Therefore, after the etching process, upper portions of the composite liner 63 (e.g., portions disposed above the upper surface of the STI regions 62) are disposed under (e.g., directly under) the dummy gate structure 75 and wrap around the channel region (see, e.g., FIG. 8) of the FinFET device 100.

FIGS. 8-11 and 12A illustrate the cross-sectional views of further processing of the FinFET device 100 along cross-section A-A (along a longitudinal axis of the fin 64) of a fin 64 (e.g., 64A or 64B). FIG. 12B illustrates the FinFET device 100 of FIG. 12A, but along cross-section B-B.

Figure 8:
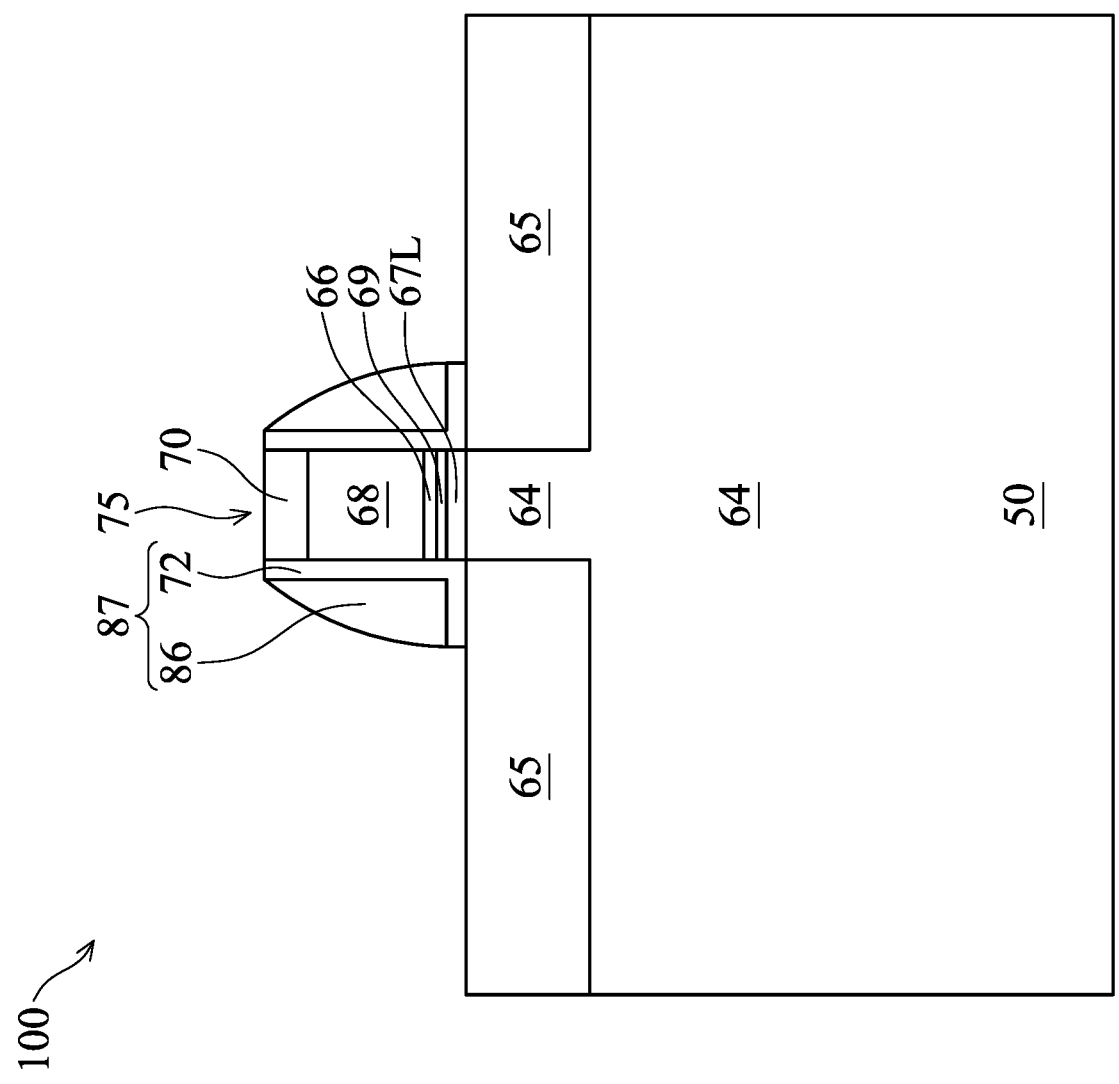

As illustrated in FIG. 8, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate electrode 68 and into the channel region of the FinFET device 100. FIG. 8 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed. In some embodiments, the LDD regions 65 are omitted.

Still referring to FIG. 8, after the LDD regions 65 are formed, gate spacers 87 are formed around the dummy gate structures 75. The gate spacer 87 may include a first gate spacer 72 and a second gate spacer 86. For example, the first gate spacer 72 may be a gate seal spacer and is formed on opposing sidewalls of the dummy gate structures 75. The second gate spacer 86 is formed on the first gate spacer 72. The first gate spacer 72 may be formed of a dielectric material such as silicon nitride, silicon oxynitride, silicon carbide, silicon carbonitride, the like, or a combination thereof, and may be formed using, e.g., a thermal oxidation, CVD, or other suitable deposition process. The second gate spacer 86 may be formed of silicon nitride, silicon carbonitride, a combination thereof, or the like using a suitable deposition method.

In an embodiment, the gate spacer 87 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the dummy gate structures 75. The second portion of the second gate spacer layer remaining after the anisotropic etch process forms the second gate spacer 86. The anisotropic etch process also removes a portion of the first gate spacer layer disposed outside of the sidewalls of the second gate spacer 86, and the remaining portion of the first gate spacer layer forms the first gate spacer 72.

The shapes and formation methods of the gate spacer 87 as illustrated in FIG. 8 are merely non-limiting examples, and other shapes and formation methods are possible. These and other variations are fully intended to be included within the scope of the present disclosure.

Figure 9:
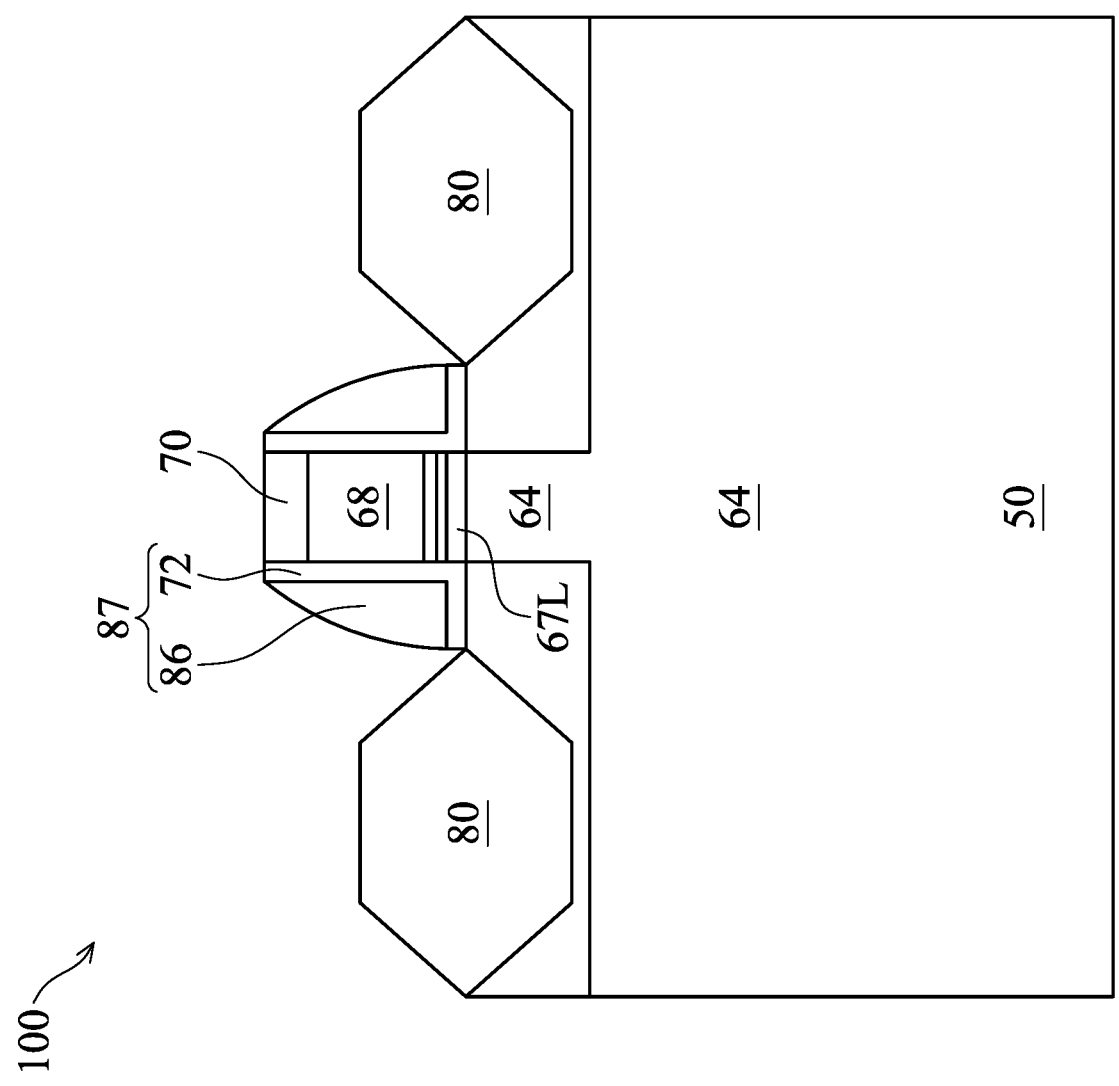

Next, as illustrated in FIG. 9, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 9, the epitaxial source/drain regions 80 may have surfaces raised from respective surfaces of the fins 64 (e.g. raised above the non-recessed portions of the fins 64) and may have facets. In embodiments where multiple fins 64 are formed in parallel and adjacent to each other, the source/drain regions 80 of the adjacent fins 64 may merge to form a continuous epitaxial source/drain region 80. In other embodiments, the source/drain regions 80 for adjacent fins 64 do not merge together and remain separate source/drain regions 80. In some embodiments, the resulting FinFET is an n-type FinFET, and source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET device 100 that are to be protected from the implanting process. The source/drain regions 80 may have an impurity (e.g., dopant) concentration in a range from about 1E19 cm$^{-3}$ to about 1E21 cm$^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Next, as illustrated in FIG. 10, a first interlayer dielectric (ILD) 90 is formed over the source/drain regions 80 and over the dummy gate structures 75. In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70. After the planarization process, the top surface of the first ILD 90 is level with the top surface of the gate electrode 68.

Next, an embodiment gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Still referring to FIG. 10, to form the replacement gate structures 97 (see FIG. 11), the gate electrode 68 and the gate dielectric 66 directly under the gate electrode 68 are removed in an etching step(s), so that recesses 91 are formed between the gate spacers 87. The etching process may stop when the remaining portions (e.g., 67L) of the liner 67 are exposed. During the dummy gate removal, the gate dielectric 66 may be used as an etch stop layer when the gate electrode 68 is etched. The gate dielectric 66 may then be removed after the removal of the gate electrode 68.

Next, in FIG. 11, a gate dielectric layer 94, a barrier layer 96, a work function layer 98, and a gate electrode 99 are formed in the recesses 91 for the replacement gate structure 97. The gate dielectric layer 94 is deposited conformally in the recesses 91, such as on the top surfaces and the sidewalls of the fins 64 and on sidewalls of the gate spacers 87, and on a top surface of the first ILD 90. In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98 is formed conformally over the barrier layer 96. Work function layers, such as P-type work function layer or N-type work function layer may be formed in the recesses over the barrier layers 96 and before the gate electrode 99 is formed. Exemplary P-type work function metals that may be included in the gate structures for P-type devices include TiN, TaN, Ru, Mo, Al, WN, ZrSi$_2$, MoSi$_2$, TaSi$_2$, NiSi$_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not separately illustrated from the gate electrode 99) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 99 is deposited over the seed layer, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer 98, the seed layer, and the gate electrode 99, which excess portions are over the top surface of the first ILD go. The resulting remaining portions of the gate dielectric layer 94, the barrier layer 96, the work function layer 98, the seed layer, and the gate electrode 99 thus form the replacement gate structure 97 of the resulting FinFET device 100.

Referring next to FIG. 12A, a second ILD 92 is formed over the first ILD go. Contact openings are formed through the second ILD 92 to expose the replacement gate structures 97 and to expose the source/drain regions 80. Contacts 102 (e.g., 102A, 102B) are formed in the contact openings.

In an embodiment, the second ILD 92 is a flowable film formed by a flowable CVD method. In some embodiments, the second ILD 92 is formed of a dielectric material such as PSG, BSG, BPSG, USG, or the like, and may be deposited by any suitable method, such as CVD and PECVD. The contact openings may be formed using photolithography and etching. The etching process etches through the first ILD 90 and the second ILD 92 to expose the source/drain regions 80 and the replacement gate structures 97.

After the contact openings are formed, silicide regions 95 are formed over the source/drain regions 80. In some embodiments, the silicide regions 95 are formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 8o, then performing a thermal anneal process to form the silicide regions 95. The un-reacted portions of the deposited metal are then removed, e.g., by an etching process. Although regions 95 are referred to as silicide regions, regions 95 may also be germanide regions, or silicon germanide regions (e.g., regions comprising silicide and germanide).

Next, contacts 102 (e.g., 102A, 102B, may also be referred to as contact plugs) are formed in the contact openings. Each of the contacts 102 includes a barrier layer 101, a seed layer 103, and a conductive material 105, and is electrically coupled to the underlying conductive feature (e.g., replacement gate structure 97, or silicide region 95), in the illustrated embodiment. The contacts 102A that are electrically coupled to the replacement gate structure 97 may be referred to as gate contacts, and the contacts 102B that are electrically coupled to the silicide regions 95 may be referred to as source/drain contacts. The materials and the formation methods for the barrier layers 101, the seed layer 103 and the conductive material 105 may be the same as or similar to those discussed above for the barrier layers 96, the seed layer, and the gate electrode 99 of the replacement gate structure 97, respectively, thus details are not repeated. In FIG. 12A, all of the contacts 102 are illustrated in a same cross-section for illustration purpose. This is, of course, an example and not limiting. The contacts 102 may be in different cross-sections.

FIG. 12B illustrates the FinFET device 100 of FIG. 12A, but along cross-section B-B. FIG. 12B illustrates a contact 102 over each of the fins 64A and 64B. The contacts 102 are electrically coupled to the replacement gate structure 97. The number and the locations of the contacts 102 are for illustration purpose only and not limiting, other numbers and other locations are also possible and are fully intended to be included within the scope of the present disclosure.

As illustrated in FIG. 12B, the lower layer 67L of the liner 67, also referred to as the interior layer of the composite liner 63, contacts and extends along sidewalls and upper surfaces of the fins 64. The conversion layer 69, also referred to as the exterior layer of the composite liner 63, is disposed between the lower layer 67L and the STI regions 62. In the example of FIG. 12B, there is no conversion layer 69 disposed above the upper surface of the STI regions 62. Note that while lower portions of the composite liner 63 (e.g., portions disposed below the upper surface of the STI regions 62) extend beyond the boundaries of the replacement metal structure 97 and covers lower sidewalls of the fins 64, the upper portions of the composite liner 63 (e.g., portions disposed above the upper surface of the STI regions 62), which only include the upper portions of the lower layer 67L in FIG. 12B, are disposed under (e.g., directly under) the replacement gate structure 97 and wrap around the channel regions of the FinFET device 100.

Figure 13:
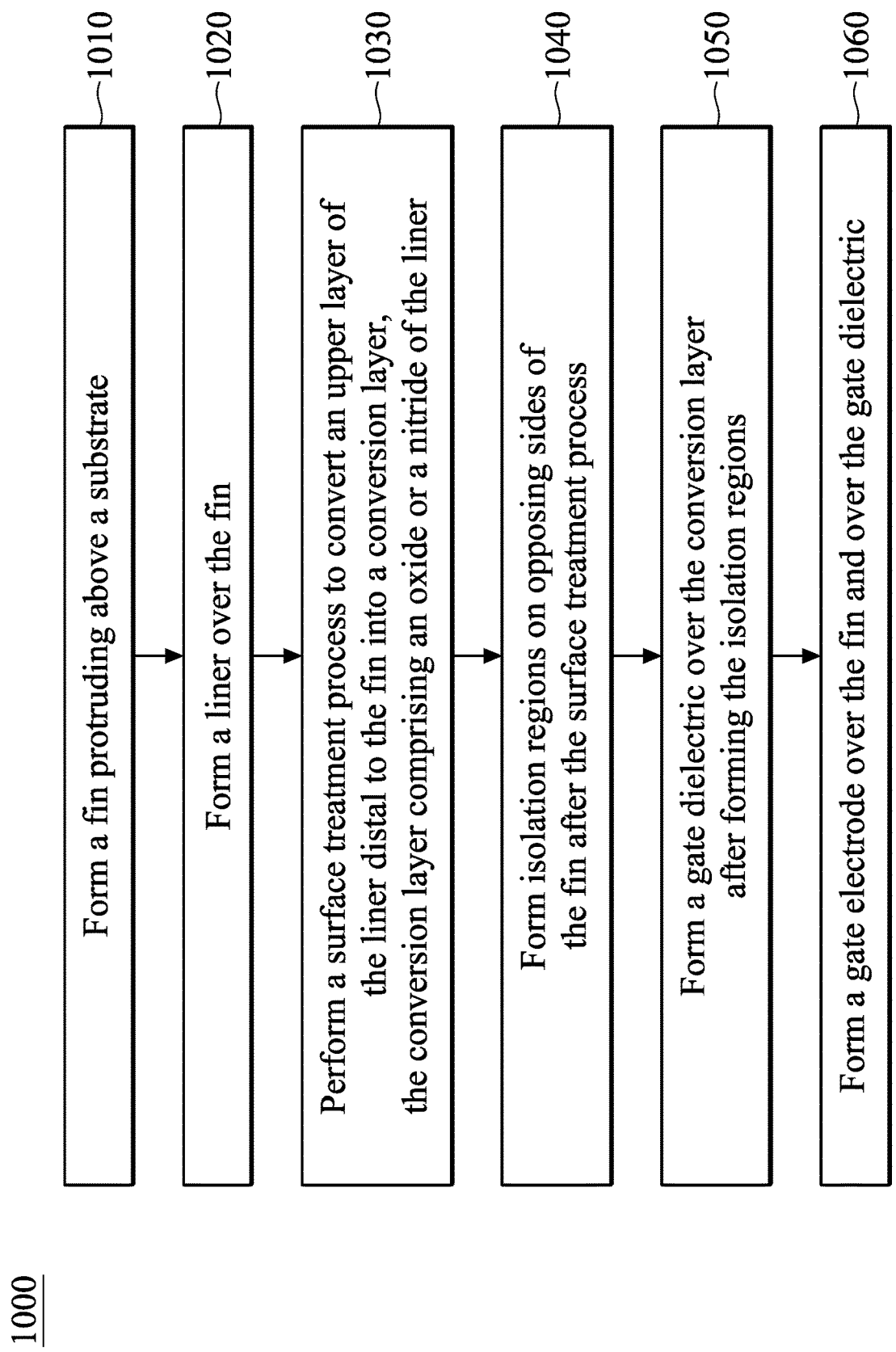
FIG. 13 illustrates a flow chart of method of forming a semiconductor device, in accordance with some embodiments.

FIG. 13 illustrates a flow chart of a method 1000 of forming a semiconductor device, in accordance with some embodiments. It should be understood that the embodiment method shown in FIG. 13 is merely an example of many possible embodiment methods. One of ordinary skill in the art would recognize many variations, alternatives, and modifications. For example, various steps as illustrated in FIG. 13 may be added, removed, replaced, rearranged and repeated.

Referring to FIG. 13, at step 1010, a fin is formed protruding above a substrate. At step 1020, a liner is formed over the fin. At step 1030, a surface treatment process is performed to convert an upper layer of the liner distal to the fin into a conversion layer, the conversion layer comprising an oxide or a nitride of the liner. At step 1040, isolation regions are formed on opposing sides of the fin after the surface treatment process. At step 1050, a gate dielectric is formed over the conversion layer after forming the isolation regions. At step 1060, a gate electrode is formed over the fin and over the gate dielectric.

Embodiments may achieve advantages. For example, the disclosed surface treatment method prevents or reduces crystallization of the liner 67 during subsequent processing. As a result, the liner 67 (e.g., the lower layer 67L) remains a smooth protection layer over the fins 64, thereby protecting, e.g., the channel regions in the fins 64 from subsequent processing. In addition, the critical dimension of the fins 64 are better preserved by the treated liner 67. Furthermore, subsequent processing after the formation of the liner 67 is no longer constrained to low temperature processing, which allows for wider choice of the subsequent processing and provides improved thermal budget.

In an embodiment, a method of forming a semiconductor device includes forming a fin protruding above a substrate; forming a liner over the fin; performing a surface treatment process to convert an upper layer of the liner distal to the fin into a conversion layer, the conversion layer comprising an oxide or a nitride of the liner; forming isolation regions on opposing sides of the fin after the surface treatment process; forming a gate dielectric over the conversion layer after forming the isolation regions; and forming a gate electrode over the fin and over the gate dielectric. In an embodiment, forming the liner comprises conformally forming the liner over sidewalls and a top surface of the fin. In an embodiment, the liner is formed of a first semiconductor material different from a second semiconductor material of the fin. In an embodiment, after the surface treatment process, the upper layer of the liner is converted into the oxide or the nitride of the liner, and a lower layer of the liner contacting the fin remains unchanged. In an embodiment, the gate dielectric and the gate electrode form a dummy gate structure, wherein the method further comprises: forming a dielectric layer over the substrate and around the dummy gate structure; and replacing the dummy gate structure with a replacement gate, wherein replacing the dummy gate structure comprises replacing the gate dielectric and the gate electrode with a high-K gate dielectric and a metal gate electrode, respectively. In an embodiment, the first semiconductor material comprises amorphous silicon, and the second semiconductor material comprises silicon germanium. In an embodiment, after the surface treatment process, the conversion layer comprises silicon oxide, and a lower layer of the liner contacting the fin comprises amorphous silicon. In an embodiment, the first semiconductor material comprises amorphous silicon, and the second semiconductor material comprises crystalline silicon. In an embodiment, performing the surface treatment process comprises treating the upper layer of the liner with a gas source that comprises oxygen. In an embodiment, performing the surface treatment process comprises cleaning the upper layer of the liner with an oxygen-containing chemical. In an embodiment, performing the surface treatment process comprises treating the upper layer of the liner with a gas source that comprises ammonia.

In an embodiment, a method of forming a semiconductor device includes forming a first fin in an N-type device region of the semiconductor device, the first fin comprising a first semiconductor material; forming a second fin in a P-type device region of the semiconductor device, the second fin comprising a second semiconductor material; forming a liner over the first fin and the second fin, the liner comprising a third semiconductor material different from the first semiconductor material and different from the second semiconductor material; converting an exterior layer of the liner distal to the first fin and the second fin into a first dielectric layer, wherein an interior layer of the liner contacting the first fin and the second fin remains the third semiconductor material after converting the exterior layer; forming isolation regions around the first fin and the second fin, wherein a first upper portion of the first fin and a second upper portion of the second fin extend above upper surfaces of the isolation regions; forming a gate dielectric over the first upper portion of the first fin and over the second upper portion of the second fin; and forming a gate electrode over the first fin, the second fin, and the gate dielectric. In an embodiment, the first semiconductor material is crystalline silicon, the second semiconductor material is silicon germanium, and the third semiconductor material is amorphous silicon. In an embodiment, the first dielectric layer comprises an oxide of the liner. In an embodiment, converting the exterior layer of the liner comprises exposing the liner to an oxygen-containing ambient, treating the liner with an oxygen-containing gas, treating the liner with a plasma of oxygen, or applying an oxygen-containing chemical on the liner. In an embodiment, the first dielectric layer comprises a nitride of the liner. In an embodiment, converting the exterior layer of the liner comprises treating the liner with an ammonia-containing gas, or treating the liner with a plasma of ammonia.

In an embodiment, a semiconductor device includes a first fin protruding above a substrate; an isolation region on opposing sides of the first fin, the first fin extending above an upper surface of the isolation region distal to the substrate; a composite liner comprising: an interior layer contacting the first fin, the interior layer comprising a first semiconductor material; and an exterior layer distal to the first fin, the exterior layer comprising a first dielectric layer, wherein the interior layer of the composite liner extends along sidewalls and an upper surface of the first fin, and the exterior layer of the composite line is disposed between the interior layer and the isolation region; a gate dielectric over the upper surface of the isolation region and extending along upper sidewalls of the first fin and along the upper surface of the first fin, wherein at least portions of the interior layer of the composite liner is between the gate dielectric and the first fin; and a gate electrode over the gate dielectric. In an embodiment, the first dielectric layer is an oxide or a nitride of the first semiconductor material. In an embodiment, the semiconductor device further comprises a second fin protruding above the substrate, wherein the composite liner extends along sidewalls and an upper surface of the second fin, wherein the first fin comprises a second semiconductor material, the second fin comprises a third semiconductor material, wherein the first semiconductor material of the composite liner is different from the second semiconductor material and the third semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a fin protruding above a substrate;
   isolation regions on opposing sides of the fin;
   a gate structure over the fin; and
   a composite liner under the gate structure, comprising:
      a first layer, wherein the first layer is a first semiconductor material, wherein the first layer directly contacts and extends continuously along a first sidewall of the fin, along an upper surface of the fin distal from the substrate, and along a second sidewall of the fin opposing the first sidewall of the fin, wherein the first layer along the upper surface of the fin and the first layer along the first sidewall of the fin have a same composition, wherein a first portion of the first layer extends above an upper surface of the isolation regions distal from the substrate, wherein a second portion of the first layer extends below the upper surface of the isolation regions; and
      a second layer, wherein the second layer is a dielectric material, wherein the second layer contacts and extends along the second portion of the first layer, wherein the second layer is disposed between the first layer and the isolation regions.

2. The semiconductor device of claim 1, wherein an upper surface of the second layer distal from the substrate is level with the upper surface of the isolation regions.

3. The semiconductor device of claim 1, wherein the dielectric material is an oxide of the first semiconductor material or a nitride of the first semiconductor material.

4. The semiconductor device of claim 3, wherein the gate structure comprises:
   a gate dielectric layer over the fin and extending along the first layer of the composite liner; and
   a gate electrode over the gate dielectric layer.

5. The semiconductor device of claim 4, wherein the gate dielectric layer is between the first layer of the composite liner and the gate electrode.

6. The semiconductor device of claim 4, wherein the gate dielectric layer contacts and extends along exterior surfaces of the first layer distal from the fin.

7. The semiconductor device of claim 1, wherein the fin comprises a second semiconductor material different from the first semiconductor material.

8. The semiconductor device of claim 7, wherein the first semiconductor material is amorphous silicon, and the second semiconductor material is silicon germanium.

9. The semiconductor device of claim 1, wherein the first layer of the composite liner has a homogeneous composition.

10. A semiconductor device comprising:
    a fin protruding above a substrate;
    isolation regions on opposing sides of the fin;
    a composite liner along exterior surfaces of the fin, comprising:
       an interior layer directly contacting and extending along sidewalls of the fin and along an upper surface of the fin distal from the substrate, wherein the fin is crystalline silicon or crystalline silicon germanium, and the interior layer is amorphous silicon, wherein the interior layer along the upper surface of the fin and the interior layer along the sidewalls of the fin have a same composition; and
       an exterior layer over the interior layer and below an upper surface of the isolation regions distal from the substrate, wherein the exterior layer is disposed between the interior layer and the isolation regions, wherein the exterior layer is a first dielectric material;
    a gate dielectric layer over the upper surface of the isolation regions, wherein the gate dielectric layer contacts and extends along the interior layer of the composite liner; and
    a gate electrode over the gate dielectric layer.

11. The semiconductor device of claim 10, wherein the first dielectric material is silicon oxide or silicon nitride.

12. The semiconductor device of claim 10, wherein an upper surface of the exterior layer is level with the upper surface of the isolation regions.

13. The semiconductor device of claim 10, wherein an upper portion of the fin protrudes above the upper surface of the isolation regions, and a lower portion of the fin is disposed below the upper surface of the isolation regions, wherein the exterior layer extends along first sidewalls of the lower portion of the fin, and the gate dielectric layer extends along second sidewalls of the upper portion of the fin.

14. A semiconductor device comprising:
    a fin protruding above a substrate;
    isolation regions on opposing sides of the fin;
    a composite liner along sidewalls of the fin and along an upper surface of the fin distal from the substrate, comprising:
       an interior layer around and directly contacting a channel region in the fin, the interior layer comprising a first semiconductor material, wherein the interior layer extends continuously along the upper surface of the fin from a first sidewall of the fin to a second opposing sidewall of the fin, wherein the interior layer along the upper surface of the fin and the interior layer along the first sidewall of the fin have a same composition; and
       an exterior layer on the interior layer, the exterior layer comprising a first dielectric material, wherein the exterior layer of the composite liner is disposed between the interior layer and the isolation regions;
    a gate dielectric layer on the interior layer, wherein the gate dielectric layer contacts and extends along the interior layer of the composite liner; and
    a gate electrode over the gate dielectric layer.

15. The semiconductor device of claim 14, wherein the interior layer extends continuously from the upper surface of the fin to the substrate.

16. The semiconductor device of claim 14, wherein an upper surface of the exterior layer distal from the substrate is level with an upper surface of the isolation regions.

17. The semiconductor device of claim 16, wherein a first portion of the gate dielectric layer contacts and extends along the upper surface of the exterior layer of the composite liner, and a second portion of the gate dielectric layer contacts and extends along the interior layer of the composite liner.

18. The semiconductor device of claim 14, wherein the fin is crystalline silicon or crystalline silicon germanium, and the interior layer is amorphous silicon.

19. The semiconductor device of claim 14, wherein the first dielectric material is a nitride of the first semiconductor material.

20. The semiconductor device of claim 14, wherein the first dielectric material is an oxide of the first semiconductor material.

* * * * *